US006402839B1

(12) United States Patent
Meier et al.

(10) Patent No.: US 6,402,839 B1
(45) Date of Patent: Jun. 11, 2002

(54) SYSTEM FOR STABILIZING DENDRITIC WEB CRYSTAL GROWTH

(75) Inventors: Daniel L. Meier, Pittsburgh; Gregory T. Neugebauer, Bethel Park; Edward V. Macuga, Finleyville; Robert P. Stoehr, Pittsburgh; Philip J. Simpson, Bridgeville; Jalal Salami, West Mifflin, all of PA (US)

(73) Assignee: Ebara Solar, Inc., Large, PA (US)

( * ) Notice: Subject to any disclaimer, the term of this patent is extended or adjusted under 35 U.S.C. 154(b) by 0 days.

(21) Appl. No.: 09/294,529

(22) Filed: Apr. 19, 1999

Related U.S. Application Data

(60) Provisional application No. 60/096,574, filed on Aug. 14, 1998.

(51) Int. Cl.$^7$ ............................................... C30B 15/34
(52) U.S. Cl. .......................... 117/208; 117/32; 117/33; 117/903
(58) Field of Search ............................. 117/32, 33, 208, 117/903; 428/157

(56) References Cited

U.S. PATENT DOCUMENTS

| 3,112,230 A | 11/1963 | Rudenberg | 136/256 |
| 4,133,698 A | 1/1979 | Chiang et al. | 136/255 |
| 4,927,770 A | 5/1990 | Swanson | 437/2 |
| 5,641,362 A | 6/1997 | Meier et al. | 136/256 |
| 6,077,345 A | 6/2000 | Easoz et al. | 117/14 |

FOREIGN PATENT DOCUMENTS

| DE | 35 24 983 A | 1/1987 |
| DE | 35 24 997 A | 1/1987 |
| GB | 2 135 594 A | 9/1984 |
| GB | 2 198 966 A | 6/1988 |
| GB | 2 240 287 A | 7/1991 |
| JP | 3-165578 | 7/1999 | 136/255 |

OTHER PUBLICATIONS

Raymond G. Seidensticker, "Dendritic Web Growth of Silicon", Crystals: Growth, Properties and Applications, vol. 8, Applications Ed. J. Grabmaier (Springer, Berlin, 1982) pp. 145–172.

D.L. Barrett et al., "Growth of Wide, Flat Crystals of Silicon Web", J. Electrochem, Soc.: Solid State Science, Jun. 1971, pp. 952–957.

K.M. Kim, "Suppression of Thermal Convection by Transverse Magnetic Field", Journal of the Electrochemical Society, vol. 129, No. 2, Feb. 1982, 3 pages.

Kinji Hosi, "Czochralski Silicon Crystals Grown in a Transverse Magnetic Field", J. Electrochem, Soc.: Solid–State Science and Technology, Mar. 1985, pp. 693–700.

(List continued on next page.)

Primary Examiner—Robert Kunemund
(74) Attorney, Agent, or Firm—Squire, Sanders & Dempsey, L.L.P.

(57) ABSTRACT

A process for dendritic web growth is described. The process includes providing a melt, growing a dendritic web crystal from the melt, replenishing the melt during the step of growing the dendritic web crystal, and applying a magnetic field to the melt during the step of growing the dendritic web crystal. An apparatus for stabilizing dendritic web growth is also described. The apparatus includes a crucible including a feed compartment for receiving pellets to facilitate melt replenishment and a growth compartment designed to hold a melt for dendritic web growth. The apparatus further includes a magnetic field generator configured to provide a magnetic field during dendritic web growth.

10 Claims, 7 Drawing Sheets

OTHER PUBLICATIONS

D.L. Meier et al.: $2^{nd}$ World Conference and Exhibition on Photovoltaic Solar Energy Conversion; "Self–Doping Contacts and Associated Silicon Solar Cell Structures," vol. II, Jul., 1998; Pp.: 1491–1494.

M.D. Lammert et al.: *IEEE Transactions on Electron Devices*; "The Interdigitated Back Contact Solar Cell: A Silicon Solar Cell for Use in Concentrated Sunlight," Apr., 1977; 6 pages.

C.M. Garner et al.: *IEEE Electron Device Letters*; "An Interdigitated Back Contact Solar Cell With High–Current Collection," vol. EDL–1, No. 12, Dec., 1980; 256–258.

R.A. Sinton, et al.: Twenty Third IEE Photovoltaic Specialists Conference; "Large–Area 21% Efficient SI Solar Cells," May, 1993; Pp. 157–161.

S. Chiang et al. *IEEE Trans. Electron Devices*, vol. ED–25, No. 12, Dec., 1978, pp. 1405–1409.

SYSTEM FOR STABILIZING DENDRITIC WEB CRYSTAL GROWTH

CLAIM OF PRIORITY

The present invention claims priority to and incorporates by reference U.S. provisional patent application No. 60/096,574 filed on Aug. 14, 1998.

BACKGROUND OF THE INVENTION

The present invention relates to a system and process for dendritic web crystal growth. More particularly, the present invention relates to a system and process for stabilizing dendritic web crystal growth.

It has long been recognized that dendritic web ribbon crystals lend themselves as nearly ideal substrates for solar cells because of their high chemical purity, low density of structural defects, rectangular shape and relatively thin crystal size. Furthermore, solar cells fabricated from dendritic web silicon enjoy light energy to electrical energy conversion efficiencies as high as 17.3%, which is comparable to high efficiencies obtained using expensive processes such as Float Zone silicon and other well known complex processes.

FIG. 1 shows a diagram of a dendritic web silicon crystal 10 in the form of a silicon ribbon or sheet emerging as a single crystal from a silicon melt 14 contained in a crucible 12. In order to solidify the web silicon crystal 10 during the crystal growth process, silicon melt 14 is maintained a few degrees below the freezing point of silicon (1412° C.) inside crucible 12. Silicon crystal 10 is typically grown by pulling upward on a top dendrite seed 22 at a speed of approximately 1.5 cm/min. The resulting dendritic web silicon crystal 10 includes a silicon web portion 16 bounded by silicon dendrites 18. The web portion 16 is typically about 3 to 6 cm in width and about 100 μm in thickness compared to the nominally square dendrites 18, which are typically about 700 μm thick. In order to sustain the above described crystal growth, the dendrite support structure should be continually regenerated at the pointed dendrite tips 20 beneath the surface of silicon melt 14.

Unfortunately, the conventional dendritic web crystal growth processes suffer from several drawbacks. By way of example, conventional dendritic web crystal growth processes are difficult to commercialize because they are "metastable" and subject to premature termination of crystal growth. Although, in rare instances a dendritic web crystal longer than about 5 m and having a width that is between about 3 and about 6 cm may be grown, minor random perturbations in the growth environment frequently prematurely terminate crystal growth. As a result, most crystals, according to conventional methods, cease growing typically after 1–2 hours when the crystals are of lengths that are between about 1 and about 2 m or far less than a commercially desirable length of 5 m or higher. Thus, conventional crystal growth techniques fail to reproducibly provide sufficiently long crystals.

As another example, added costs and wasted time associated with premature termination of crystal growth make the conventional web crystal growth process undesirable. After the premature termination of crystal growth, it takes an operator 1 to 2 hours to configure the dendritic web crystal growing system to start growing the next crystal. Consequently, valuable labor costs and time are expended to begin crystal growth again.

As yet another example, when conventional web crystal growth techniques are employed, most crystals grow in transient, rather than steady-state conditions. A crystal starting out at a width of about 3 cm gradually widens due to transient conditions to a value that is between about 5 and about 6 cm over several meters of length. The completed crystal must be trimmed so as to have a consistent width along the entire length. Thus, solar cells that are currently fabricated from web crystal ribbons produced by conventional techniques are done so at the expense of valuable excess web crystal surface that is wasted.

What is, therefore, needed is a system and method for stabilizing dendritic web crystal growth that can be commercialized without suffering from the drawbacks of the conventional methods described above.

SUMMARY OF THE INVENTION

The present invention provides an improved system and process of dendritic web crystal growth, which substantially overcomes the above-noted problems of premature termination of crystal growth. In one aspect, the present invention provides a process for dendritic web growth that includes: providing a melt; growing a dendritic web crystal from the melt; replenishing the melt during the step of growing the dendritic web crystal; and applying a magnetic field to the melt during the step of growing the dendritic web crystal.

The dendritic web crystal of the present invention may be a silicon or a germanium crystal. The melt employed in one embodiment of the present invention, therefore, includes at least one material selected from the group consisting of silicon and germanium. In another embodiment of the present invention, the melt further includes tin.

The step of applying the magnetic field to the melt may include providing a magnetic field strength that allows dendrites that support the web crystal to be continually regenerated underneath a surface of the melt. The magnetic field strength may generally be greater than or equal to about 400 Gauss and may preferably be between about 400 and about 2500 Gauss.

In accordance with one embodiment of the present invention, the step of growing includes pulling a silicon seed crystal from the melt. The dendritic web crystal is pulled at a rate that is generally greater than or equal to about 1.5 cm/min, and preferably greater than or equal to about 1.8 cm/min, to ensure that growth of the dendritic web silicon crystal does not prematurely cease.

The step of replenishing the melt may include delivering silicon pellets to the melt. The pellet delivery rate is generally greater than or equal to 0.20 g/min and is preferably greater than or equal to 0.40 g/min.

In one embodiment of the present invention, the step of applying the magnetic field includes producing a magnetic field that is oriented perpendicular to the plane of the web crystal. Alternatively, in another embodiment of the present invention, the magnetic field is oriented parallel to the plane of the web crystal in the horizontal direction. In yet another embodiment of the present invention, the magnetic field is in the vertical direction and perpendicular to the plane of the melt.

In another aspect, the present invention provides an apparatus for dendritic web growth. The apparatus includes: (1) a crucible including a feed compartment for receiving pellets to facilitate melt replenishment and a growth compartment designed to hold a melt for dendritic web growth; and (2) a magnetic field generator configured to provide a magnetic field during dendritic web growth.

The apparatus of the present invention further includes a growth furnace and the crucible mentioned above is disposed within the growth furnace. The magnetic field generator, according to one embodiment of the present invention, includes an electromagnet or a permanent magnet, which is mounted outside the growth furnace. The magnetic field generator of the present invention may be a superconducting magnet that is mounted outside the growth furnace. In embodiments where magnet pole pieces serve as magnetic field generators of the present invention, the magnet pole pieces include at least one portion that is located outside the growth furnace.

In accordance with one embodiment of the present invention, the magnetic field generator is configured to produce a magnetic field that is oriented perpendicular to the plane of the web crystal and a power consumed by the magnetic field generator to produce the magnetic field of sufficient strength is reduced. Alternatively, in another embodiment of the present invention, the magnetic field generator is configured to produce a magnetic field that is oriented in the horizontal direction and parallel to the plane of the web crystal. The magnetic field generator may also be configured to produce a magnetic field that is in the vertical direction and perpendicular to the plane of the web melt.

In yet another aspect, the present invention provides a dendritic web crystal fabricated using a process which includes: providing a melt; growing a dendritic web crystal from the melt; replenishing the melt during the step of growing the dendritic web crystal; and applying a magnetic field to the melt during the step of growing the dendritic web crystal. The step of applying the magnetic field to the melt may include providing a magnetic field strength that allows dendrites that support the web crystal to be continually generated underneath a surface of the melt.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings in which.

DESCRIPTION OF THE PREFERRED EMBODIMENTS

Figure 1:
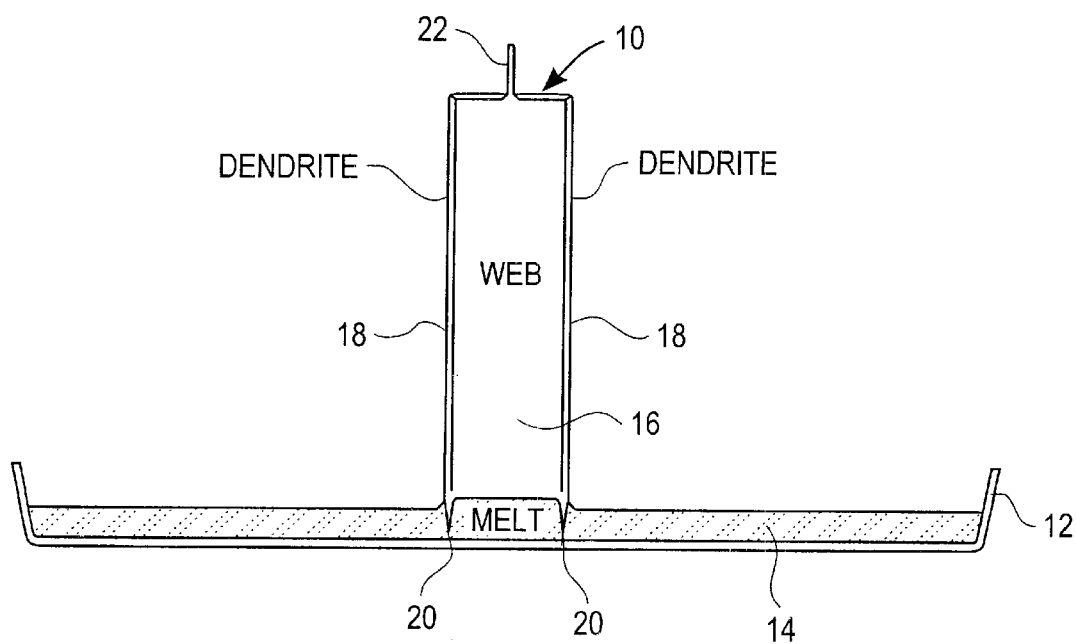
FIG. 1 shows a cross-sectional view of a dendritic web silicon crystal growing, according to conventional techniques, from a silicon melt.

The present invention will now be described in detail with reference to the presently preferred embodiments as illustrated in accompanying drawings. In the following description, numerous specific details are set forth in order to provide a thorough understanding of the present invention. It will be apparent, however, to one skilled in the art, that the present invention may be practiced without some or all of these specific details. By way of example, the advantages offered by the systems and processes of the present invention apply to, but are not limited to, growth of dendritic web silicon crystal. Dendritic web crystals that include germanium may also be grown using the processes and systems of the present invention. In other instances, well known process steps and/or structures have not been described in detail in order to not unnecessarily obscure the present invention.

Although dendritic web crystal growth process has been known for over 35 years and has the above-noted advantages for solar cell applications, the technology is not commercially viable due to its metastable nature. The commercialization of the dendritic web crystal growth process has been impeded because the conventional dendritic web crystal growth systems and methods employed have failed to recognize the reasons for the premature termination of crystal growth. Furthermore, the principles of commercially viable bulk crystal growth processes, such as Czochralski, Float Zone and Bridgman, contribute little or nothing to commercialization of dendritic web crystal growth processes because bulk crystal growth processes enjoy stable crystal growth and do not suffer from premature termination of crystal growth. The stability of bulk crystal growth processes at least partially follows from the fact that bulk crystals of appreciable mass are grown out of a large melt/crystal interface area. The appreciable crystal mass renders the bulk crystal growth processes relatively insensitive to temperature fluctuations of the melt at the melt/crystal interface. Consequently, the large crystal mass in the bulk crystal growth processes serves as a thermal ballast.

The present invention recognizes that the growth of thin ribbon crystals by the dendritic web technique, however, do not have the advantage of this thermal ballast. On the contrary, in order to sustain dendritic web crystal growth, two fine, needle-like dendrites, which penetrate approximately 5 mm into the melt must continue to form. These dendrites are too small to afford the web crystal sufficient thermal ballast to withstand melt temperature fluctuations. As a result, the low mass of dendrites and the small melt/crystal interface area do not lend sufficient thermal ballast to offset temperature fluctuations, which arise from convective flow in the melt fluid. Thus, dendritic web crystal growth is fundamentally less stable than bulk crystal growth.

While intending not to be bound by theory, the present invention identifies the chaotic motion of convection cells in the melt as being responsible for random temperature fluctuations as well as physical agitation that lead to the premature termination of the crystal growth process. As is explained below, a crucible containing the liquid melt is typically divided into a feed chamber, which accepts replenishment pellets during crystal growth, and a growth chamber from which the growing crystal emerges. Simultaneously growing a crystal from the melt and feeding pellets to replenish the melt place opposing demands on the liquid silicon melt. In the vicinity of the growing crystal, the liquid should be cooled below its melting point (supercooled) in order to continue to freeze the melt composition as crystal. Not far away from where the growing crystal emerges, the liquid silicon should be heated above its melting point so that the pellets being fed will replenish the melt.

Although, the crucible includes a barrier to separate the feed and growth chambers, it is determined that the barrier alone does not provide the requisite thermal isolation for stable crystal growth. According to the present invention, a magnetic field applied to the melt during the crystal growth process effectively affords the requisite additional thermal isolation between the growth and feed chambers. Under a magnetic field of sufficient strength, the convective heat transfer from the hot feed chamber to the cold growth chamber is significantly suppressed. Thus, the application of magnetic field exerts a drag that effectively suppresses convective heat transfer from feed chamber to growth chamber, thereby easing the task of feeding the melt during the crystal growth process.

In order to appreciate the effect of random temperature fluctuations on crystal growth in the absence of a magnetic field, it is important to recognize that dendrite thickness provides a reliable indication of melt temperature in the vicinity of the growing submerged dendrite. As the local temperature of the melt surrounding the growing dendrite decreases, the dendrite becomes thicker and as that local temperature increases, the dendrite becomes thinner. Thus, the thickness of each dendrite in real time (as the crystal grows) may be measured and recorded, using a video camera and image analysis software, for example, to generate a record of the effective local melt temperature.

Figure 2:
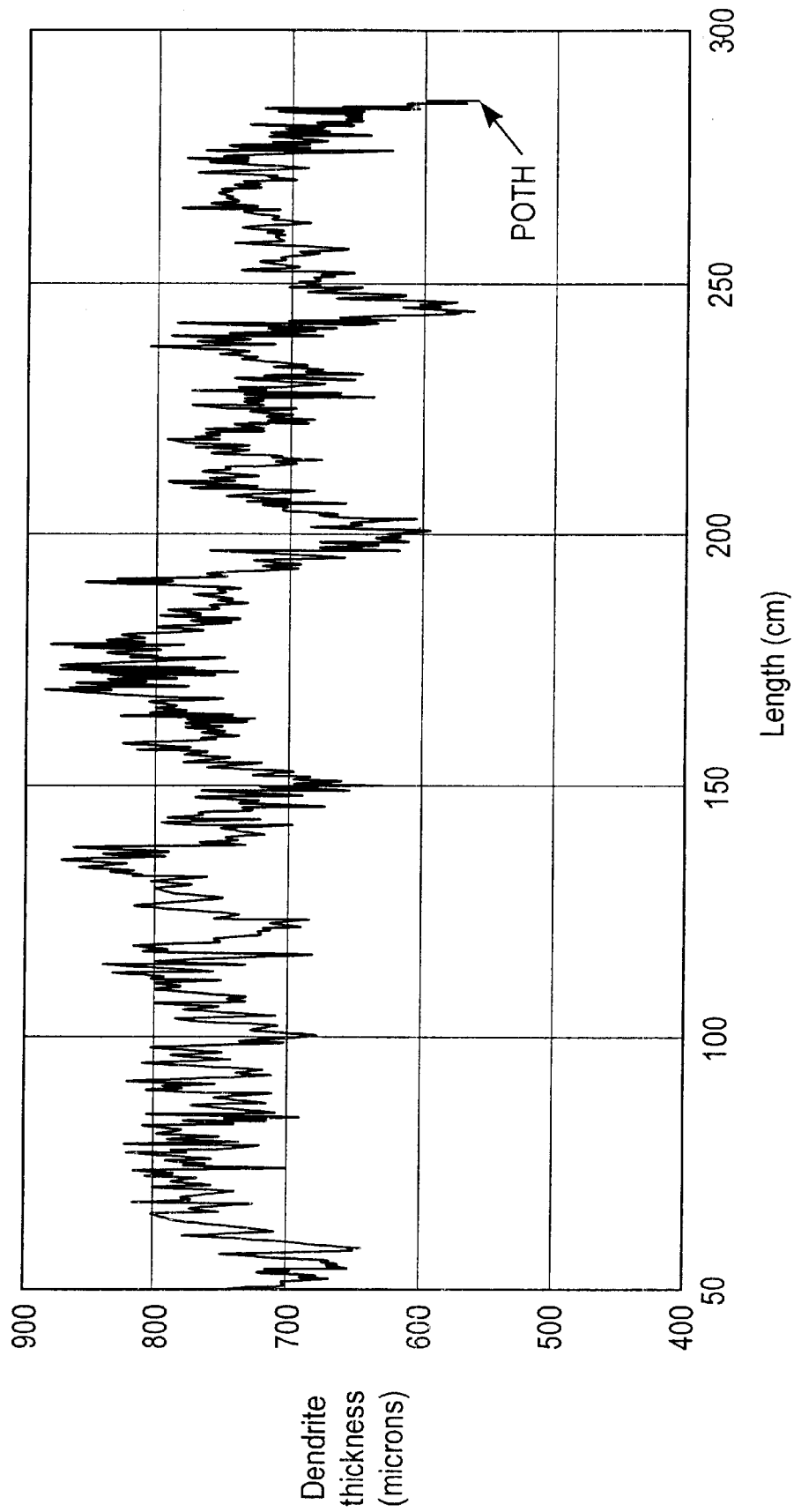
FIG. 2 shows a graphical representation of dendrite thickness versus the dendrite length for a dendritic web silicon crystal that is grown using conventional techniques.

FIG. 2 is provided as an exemplary graphical representation of the dendrite thickness versus the dendrite length for a crystal that terminated at a length of 280 cm. As shown in FIG. 2, prior to termination, the dendrite thickness varies from between about 580 to about 880 $\mu$m. Several dendrite measurements reveal that the operating "window" of dendrite thickness for sustained growth is approximately 300 $\mu$m wide, centered roughly at about 700 $\mu$m for the example of FIG. 2. This 300 $\mu$m wide dendrite thickness window corresponds to an about 3° C. wide temperature window within which the crystal can grow. It is believed that the crystal of FIG. 2 terminated when the dendrite became too thin because the melt in the vicinity of those dendrites became too hot. At high enough temperatures, the dendrites no longer regenerate themselves and, therefore, the supporting structure for the web crystal is lost. The crystal of FIG. 2 failed because of "pull-out-too-hot" (indicated as "POTH" in FIG. 2), as it is commonly known in the art, at a dendrite thickness of approximately 550 $\mu$m.

According to the present invention, dendrite thickness of a growing crystal approaching a predefined upper limit signals that the local melt temperature is becoming too cold and that the crystal is in danger of forming an additional, unwanted dendrite between the two bounding dendrites. This third dendrite, commonly referred to in the art as a "3rd," disrupts the growth of the thin web portion and frequently causes the web portion to lose its single crystal structure. Consequently, the growing crystal runs the risk of being prematurely terminated. The dendrite of FIG. 2, for example, became as thick as 880 $\mu$m, signaling that the crystal was in danger of terminating prematurely by the formation of a 3rd at that time.

The entire operating window of 300 $\mu$m is consumed during the growth of the 280 cm crystal, as shown in FIG. 2. Such variation in dendrite thickness, corresponding to variation in melt temperature, is typical and is largely uncontrollable by the crystal furnace operator. These variations, according to the present invention, are a reflection of the randomness inherent in the web growth process and are the reason for termination of crystals at random lengths. Essentially, the probability that crystal growth will be sustained through a given period of time (e.g., 10 minutes) is constant, regardless of how long the crystal had been growing up to that time. Such randomness causes web crystals to terminate prematurely, unpredictably, and precludes growth of crystals "at will."

In an effort to combat the above mentioned drawbacks, the present invention in one embodiment provides a process that includes applying a DC magnetic field of sufficient strength to the melt, from which the dendritic web crystal is grown. The magnetic field applied to the melt moves the dendritic web crystal growth process from a region of metastability to a region of stability, thereby enabling steady-state growth of long crystals.

Figure 3:
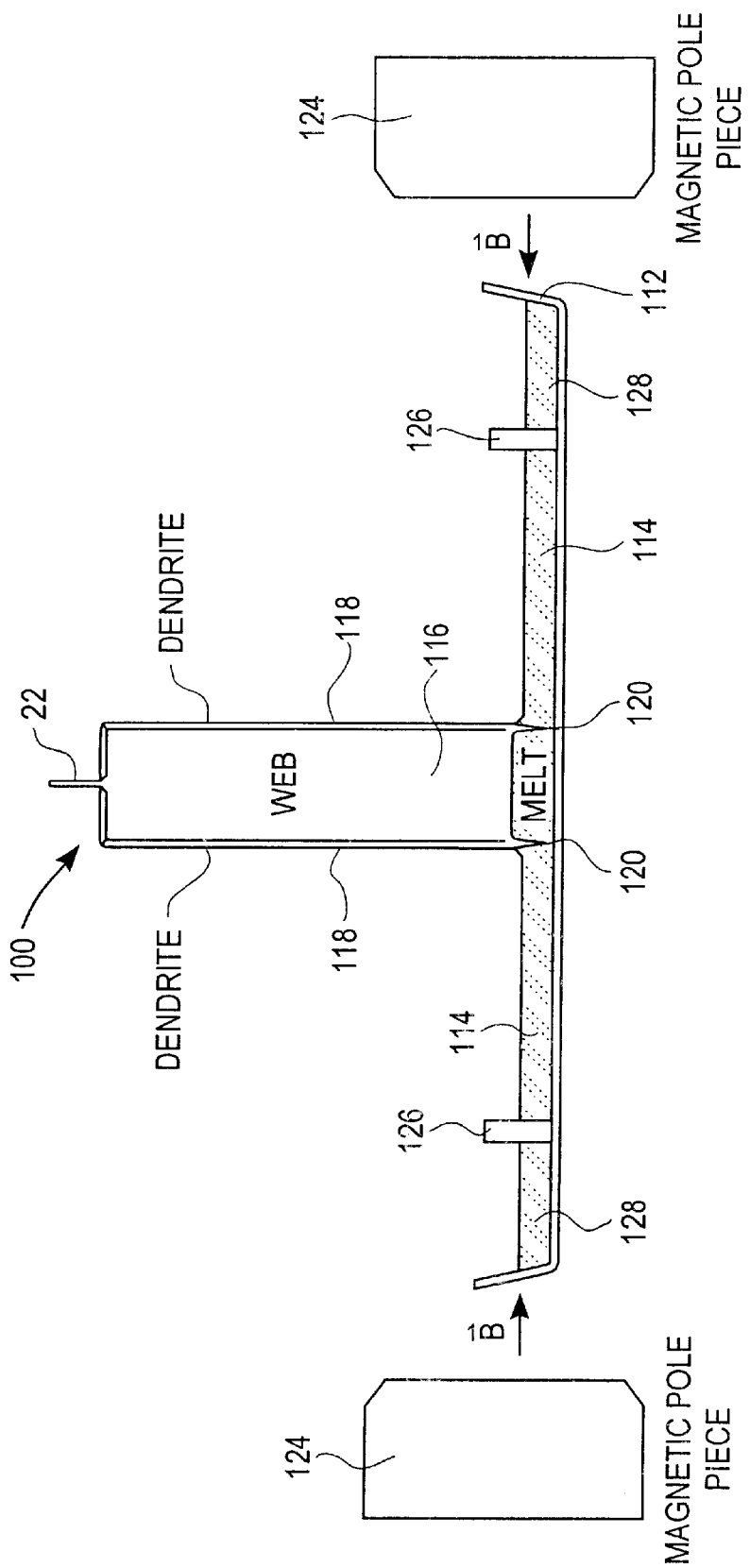
FIG. 3 shows a cross-sectional view of a system for stabilizing dendritic web silicon crystal growth, according to one embodiment of the present invention.

FIG. 3 shows a system 100 for stabilizing dendritic web silicon crystal growth, according to one embodiment of the present invention. Dendrites 118, web portion 116, dendrite seed 122, and pointed tips 120 beneath the melt surface are shown in FIG. 3 in substantially the same configuration as shown in FIG. 1.

Referring to FIG. 3, during crystal growth crucible 112 contains melt 114 inside the growth chamber and melt 128 inside the feed chamber. A small opening (not shown to facilitate illustration) in barrier 126 allows molten silicon to flow from the feed chamber to the growth chamber. Melt 114 is maintained at cool enough temperatures so that it is below its melting point (supercooled) to continually freeze the melt composition as crystal. Melt 128, in contrast, is heated above its melting point so that the pellets being fed will melt inside crucible 112. A pair of magnetic field generators 124 flank crucible 112 and the growing dendritic web crystal. Magnetic field generators 124 are capable of applying a DC magnetic field throughout melt 114 to effectively suppress the undesired convection.

By appropriately placing magnetic field generators 124 near or about the system of FIG. 3, the magnetic field is either oriented horizontally or vertically. In the horizontal direction, the magnetic field produced may be directed at the melt in the X-direction, i.e. parallel or in the plane of the web crystal, or Y-direction, i.e. perpendicular to the plane of the web crystal. In the vertical direction, the magnetic field is directed in the Z-direction. Referring to FIG. 3, in the X-direction, the magnetic field impinges on dendrites 118, in the Y-direction, the magnetic field impinges on the face of web portion 116, and in the Z-direction, the magnetic field impinges on dendrite seed 122 as it is being pulled away from the melt.

Several factors may be considered when deciding on which orientation of the magnetic field is preferred in a particular implementation of the present invention. By way of example, a magnetic field generated in the horizontal direction, may be preferred either parallel or perpendicular to the plane of web crystal depending on whether performance or power consumption of the magnets are to be optimized. A magnetic field that is parallel to the plane of the web crystal may provide high performance, e.g., increased pull speed, higher feed rates and greater stability, at the expense of relatively high power requirements. In contrast, a magnetic field of similar strength that is perpendicular to the plane of the web crystal may effectively function under reduced power consumption at the expense of relatively poorer performance.

As another example, orientations that allow a smaller gap between the magnetic field generators offer reduced power consumption by the magnet coils of the magnetic field generator. In order to effectively suppress melt convection, a magnetic field strength is generally greater than or equal to 400 Gauss and preferably between about 400 and about 2500 Gauss.

The requisite magnetic field can be created by magnetic field generators, such as electromagnets, e.g., conventional iron-core magnets and superconducting magnets, or by permanent magnets. The magnetic field generators may be placed at different locations depending on how the crystal growth process is implemented. In those embodiments where a growth furnace is employed, e.g., the embodiment of FIG. 6, the permanent magnet may be mounted inside the growth furnace or alternatively the permanent magnet is mounted outside the growth furnace. Furthermore, in those embodiments where a superconducting magnet is employed, the superconducting magnet is generally mounted outside the growth furnace. In a preferred embodiment, however, various components of the system shown in FIG. 3 are constructed from materials that are substantially undisturbed by the presence of a magnetic field.

Figure 4:
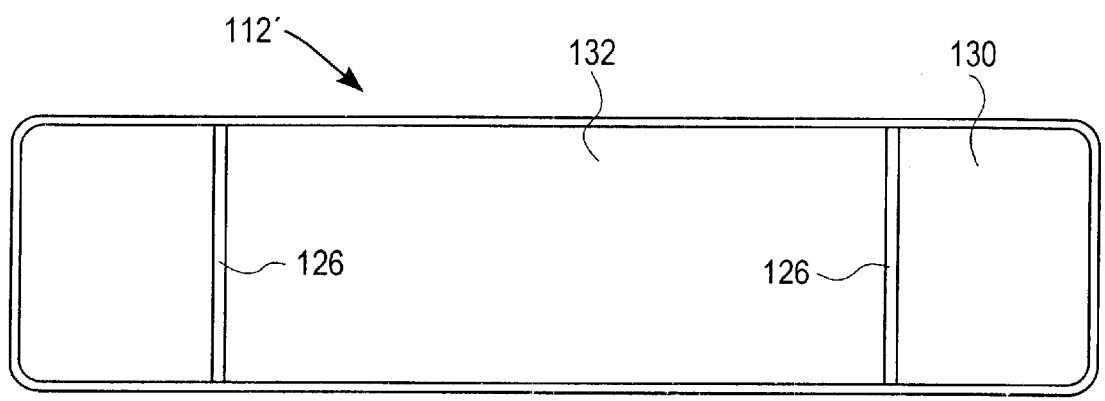
FIG. 4 shows a top view of an empty crucible, without a liquid melt, that is employed in the system of FIG. 3.

FIG. 4 shows a top view of an empty crucible 112', i.e. without containing liquid melts 114 and 128 shown in FIG. 3. In accordance with one embodiment, crucible 112' includes a growth chamber 132, from which the growing crystal emerges, that is disposed between two feed chambers 130, which accept the replenishment pellets. Those skilled in the art will recognize that it is not necessary to have the growth chamber sandwiched between two feed chambers and in another embodiment, the growth chamber may be disposed adjacent a single feed chamber.

The balance between freezing and melting may be precarious, and modest adjustments in heater power can compromise growth conditions or feeding conditions. In an attempt to strike the appropriate balance between melting and feeding conditions, barriers 126 provide some measure of thermal isolation between these chambers. However, as mentioned above, the thermal isolation provided by barriers 126 alone is not sufficient to ensure simultaneous growth and feeding. To this end, the present invention applies a magnetic field of sufficient strength to enhance the rate at which silicon pellets can be fed into the melt during crystal growth.

Figure 5:
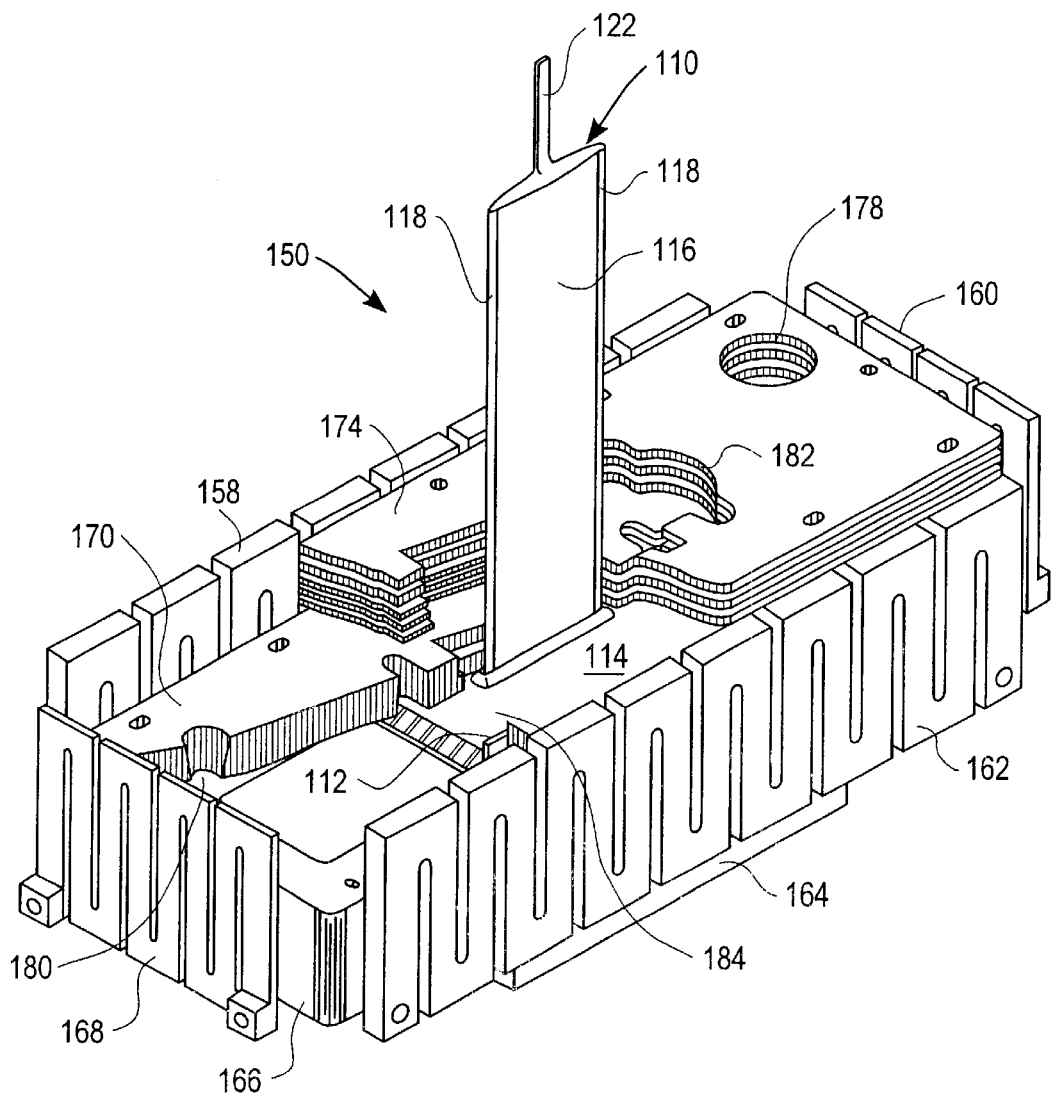
FIG. 5 shows a cut-away perspective view of a growth hardware, in which the dendritic web silicon crystal growth shown in FIG. 3 is carried out according to one embodiment of the present invention.

FIG. 5 shows a growth hardware 150 as an example of one implementation that has incorporated therein the crucible structure shown in FIG. 4. Thus, dendritic web crystal 110, crucible 112, web portion 116, dendrites 118, silicon melt 114, and dendrite seed 122 of FIG. 5 are in substantially the same configuration as shown in FIG. 3. Growth hardware 150, as is explained below, defines the temperature in and around melt 114 and accommodates the feeding of pellets for melt replenishment during crystal growth. The dendritic web crystal is extracted from a growth compartment 184 of melt 114, which is contained in a quartz crucible 112, through a bow-tie shaped slot in a molybdenum (Mo) lid 170 and shields 174.

During crystal growth, a constant depth of melt 114 is maintained by replenishing the melt composition, typically in the form of pellets, through a feed hole 178 and into feed compartment 180. The depth may generally be between about 7 and about 15 mm and preferably be between about 7 and 8 mm. A reflecting laser beam (not shown to simplify illustration) penetrating a laser slot 182 effectively monitors the melt surface during the crystal growth process from the surface of growth hardware 150. In order to set pellet feed rates in the illustrated embodiment, it is preferable to employ a melt level sensing system described in U.S. patent application Ser. No. 08/833,857, filed Apr. 10, 1997 and entitled "Silicon Crystal Growth Melt Level Control System and Method," which is incorporated herein by reference for all purposes.

Resistance heaters 158, 160, 162, 164 and 168 surround and impart sufficient thermal energy through susceptor 166 to the components of growth hardware 150 and the growing dendritic web crystal to ensure that they are maintained at the appropriate temperature during crystal growth. As mentioned before, the temperature inside feed compartment 180 is maintained above the melting point of melt composition and the temperature inside growth compartment 184 is maintained at a temperature below the melting point of the melt composition. Thermal isolation between feed compartment 180 and growth compartment 184 is facilitated by a barrier, e.g., quartz barrier, positioned between the compartments. Graphite thermal insulation (not shown to simplify illustration) further surrounds much of growth hardware 150 to prevent undesired heat losses. Shields 174 serve to reduce heat loss from hot lid 170, tailor the vertical temperature profile of web 110 and effectively cool the web in a controlled fashion to minimize thermal stress.

Figure 6:
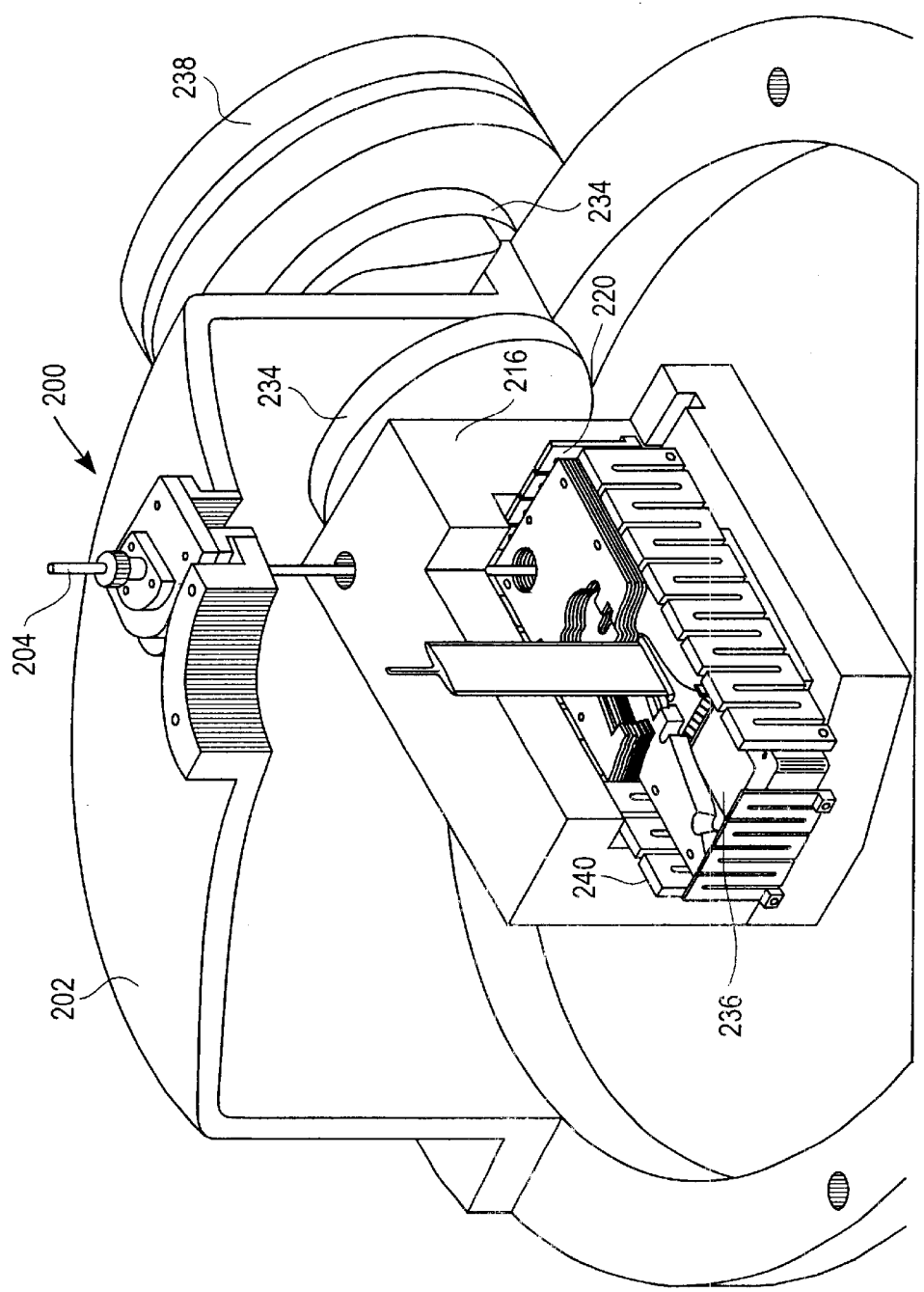
FIG. 6 shows a cut-away perspective view of a growth furnace that has incorporated therein the growth hardware of FIG. 5 for producing dendritic web silicon crystals with magnetic melt stabilization, according to one embodiment of the present invention,.

FIG. 6 shows a partial melt stabilization system, in accordance with one embodiment of the present invention, including an electromagnet that has been integrated into a standard resistance-heated dendritic web crystal growth furnace 200 (hereinafter referred to as a "growth furnace" to facilitate discussion). Growth furnace 200 includes a shell 202 for housing a growth hardware 236 that is substantially similar to growth hardware 150 of FIG. 5. Growth furnace 200 comes equipped with a pellet feed tube 204 that facilitates feeding pellets, e.g., 1 mm silicon pellets, typically at room temperature to the feed compartment of growth hardware 236 through a feed hole in the growth hardware. Magnetic field generators 234, however, one of which is shown in FIG. 5, comprise pole pieces, which are connected to magnetic coils 238 and carried to the interior of growth furnace 200 and terminate just outside the insulation 216. The corresponding half of magnetic pole pieces and coils on the left side of the growth hardware are not shown to simplify illustration. In this embodiment, the magnetic field is oriented horizontally in the plane of the web.

In accordance with the illustrated embodiment of the present invention, pole pieces 234 may be extended into furnace shell 202 to just outside the graphite insulation 216 to increase the field strength for a given power dissipation. The resultant gap between pole pieces 234, which may be about 12 inches in diameter, is about 19 inches, for example. In this embodiment, a field strength of about 2000 Gauss is achieved at the center of the melt and a power dissipation of about 20 kW in magnet coils 238 is required. Other configurations of pole pieces, shell and insulation are also possible, however.

A process, according to one embodiment of the present invention, includes providing a melt in crucible 112 of FIG. 5, for example. A dendritic web crystal is grown or pulled using conventional techniques well known to those skilled in the art. As the melt composition depletes with the growing crystal, pellets are fed into crucible to replenish the melt composition. A magnetic field of sufficient strength is then applied to the melt during the crystal growth process. The melt includes at least one material selected from the group consisting of silicon and germanium and in some embodiments further includes tin. By way of example, the melt may include in addition to a small amount of dopant, pure silicon or germanium, or silicon and tin, or germanium and tin. According to the present invention, applying the magnetic field to the melt effectively allows portions of the two dendrites submerged beneath the melt surface to be continually regenerated.

Figure 7:
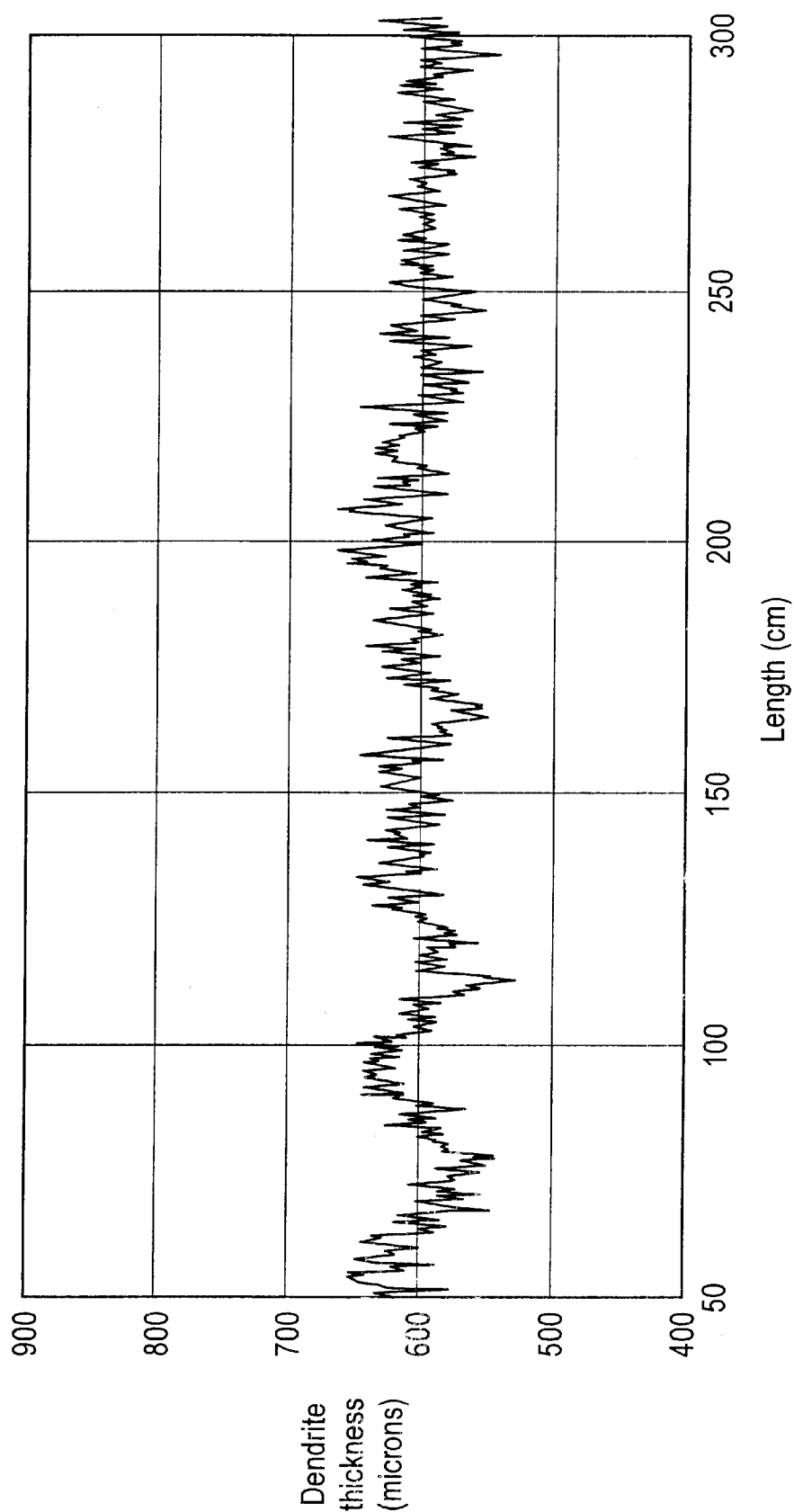
FIG. 7 shows a graphical representation of dendrite thickness versus the dendrite length for a dendritic web silicon crystal that is grown according to the present invention.

FIG. 7 shows a graph of dendrite thickness versus dendrite length for a silicon dendritic web crystal grown according to the present invention using the apparatus shown in FIG. 6. At a magnetic field strength of about 2000 Gauss and a pull rate of about 1.53 cm/min, the web crystal of FIG. 7 grew to 37.7 m, which at the time of growth was the longest dendritic web crystal ever produced, surpassing the previous known record of 23 m. FIG. 7, however, shows a variation, i.e. from about 530 $\mu$m to about 660 $\mu$m, in dendrite thickness over a typical 250 cm length portion of a web crystal, which has a width of about 3.8 cm and an average thickness of about 113 $\mu$m. Crystal growth, according to the present invention, is stabilized because the range of thickness variation of about 130 $\mu$m, as shown in FIG. 7, consumes less than half of the available 300 $\mu$m window. It is worthwhile to recall that a crystal grown according to conventional techniques consumes the entire 300 $\mu$m window, as shown in FIG. 2, and prematurely terminates from a thermal cause (POTH or 3rd).

Magnetic melt stabilization, according to the present invention, for dendritic web crystal growth significantly reduces convection and offers numerous advantages that are not realized by the conventional dendritic web crystal growth systems and methods. By way of example, applying a magnetic field significantly suppresses the convective heat transfer from the hot feed chamber to the cold growth chamber and therefore effectively provides additional thermal isolation between feed and growth chambers. In this way the feed chamber is maintained at the appropriate high temperature without disturbing growth conditions in the growth compartment. Crystal growth, according to the present invention, is, therefore, characterized as having a balanced mass flow rate, which is achieved when the pellet feed rate matches the crystal growth or pull rate. Thus, the melt of the present invention is continuously and fully replenished.

As another example, the present invention enables a higher pellet feed rate during crystal growth. Usually a narrow set of thermal conditions can be found to accommodate both growth and feeding at a rate of approximately 0.2 g/min without a magnetic field. According to the present invention, application of a horizontal magnetic field in the plane of the web significantly broadens the set of conditions which accommodate simultaneous growth and feeding. Feeding rates up to approximately 0.4 g/min and higher, almost or more than double that which can be achieved without a magnetic field, are realized during crystal growth. Higher pull speeds and feed rate of pellets for the melt translate into a higher overall throughput for the crystal growth process of the present invention. Thus, a more robust dendritic web crystal growth process is achieved.

As yet another example, dendritic web crystal growth of the present invention provides higher pull speeds, which are not realized using conventional methods. Those skilled in the dendritic web crystal growth art will recognize that the term "pull speed" refers to the speed at which the growing web crystal is pulled from the melt during the web crystal growth process. Pull speeds as high as about 1.8 cm/min and higher, compared to the current pull speeds of 1.5 cm/min, are realized by the system and processes of the present invention.

As yet another example, crystal growth according to the present invention provides thinner and smoother dendrites. Thinner dendrites are desirable because a smaller amount of the web crystal is wasted or discarded when the dendrites are cut off to fabricate solar cells. It is desirable to have smoother dendrites because fewer structural defects (dislocations) are initiated from smooth dendrites than from rough ("choppy") dendrites. Dislocations from rough dendrites run the risk of propagating from the dendrite into the web portion, which serves as the substrate material for solar cell fabrication, to degrade the electrical properties of the web portion.

It can therefore be appreciated that new and novel processes and systems for dendritic web growth have been described. It will be appreciated by those skilled in the art that, given the teaching herein, numerous alternatives and equivalents will be seen to exist which incorporate the invention disclosed hereby. As a result, the invention is not to be limited by the foregoing exemplary embodiments, but only by the following claims.

What is claimed is:

1. An apparatus for dendritic web growth, comprising:
   a crucible including a feed compartment for receiving pellets to facilitate melt replenishment and a growth compartment designed to hold a melt for dendritic web growth of a web crystal; and
   a magnetic field generator configured to provide a magnetic field, oriented perpendicular to plane of the melt.

2. The apparatus of claim 1, further comprising a growth furnace, wherein said crucible is disposed within said growth furnace.

3. The apparatus of claim 2, wherein the magnetic field generator is a permanent magnet that is mounted outside the growth furnace.

4. The apparatus of claim 2, wherein the magnetic field generator is a superconducting magnet that is mounted outside the growth furnace.

5. The apparatus of claim 2, wherein the magnetic field generator includes magnet pole pieces having at least one portion that is located outside the growth furnace.

6. The apparatus of claim 2, wherein the magnetic field generator includes an electromagnet or a permanent magnet.

7. An apparatus for dendritic web growth, comprising:
   a crucible including a feed compartment for receiving pellets to facilitate melt replenishment and a growth compartment designed to hold a melt for dendritic web growth of a web crystal; and
   a magnetic field generator configured to provide a magnetic field, of a magnitude between 400 and 1160 Gauss, during dendritic web growth, wherein the magnetic field generator is configured to produce a magnetic field that is oriented perpendicular to the plane of the web crystal.

8. The apparatus of claim 7, wherein the magnetic field generator is configured to produce a magnetic field that is oriented in the horizontal direction and parallel to the plane of the web crystal.

9. An apparatus for dendritic web growth, comprising:
   a crucible including a feed compartment for receiving pellets to facilitate melt replenishment and a growth compartment designed to hold a melt for dendritic web growth of a web crystal; and
   a magnetic field generator configured to provide a magnetic field, of a magnitude between 400 and 1160 Gauss, during dendritic web growth, wherein the magnetic field generator is configured to produce a magnetic field that is oriented in the horizontal direction.

10. An apparatus for dendritic web growth, comprising:
    a crucible including a feed compartment for receiving pellets to facilitate melt replenishment and a growth compartment designed to hold a melt for dendritic web growth of a web crystal;
    a growth furnace within which the crucible is disposed; and
    a magnetic field generator configured to provide a magnetic field during dendritic web growth, wherein the magnetic field generator is disposed at least partially within the growth furnace.

* * * * *

UNITED STATES PATENT AND TRADEMARK OFFICE
CERTIFICATE OF CORRECTION

PATENT NO.   : 6,402,839 B1
DATED        : June 11, 2002
INVENTOR(S)  : Meier et al.

It is certified that error appears in the above-identified patent and that said Letters Patent is hereby corrected as shown below:

Column 10,
Line 28, change "The apparatus of claim 2, wherein the magnetic field" to -- The apparatus of claim 1, wherein the magnetic field --

Signed and Sealed this

Twenty-fifth Day of March, 2003

JAMES E. ROGAN
*Director of the United States Patent and Trademark Office*